United States Patent [19]
Baudart et al.

[11] Patent Number: 5,729,477
[45] Date of Patent: Mar. 17, 1998

[54] METHOD AND APPARATUS FOR ELIMINATING A DISTURBING COMPONENT FROM A PERIODIC SIGNAL, AND APPLICATION TO AN ELECTRONIC CAPACITOR VOLTAGE TRANSFORMER

[75] Inventors: Christophe Baudart; Jean-Paul Gris, both of Lyons, France

[73] Assignee: GEC Alsthom T & D SA, Paris, France

[21] Appl. No.: 442,408

[22] Filed: May 16, 1995

[30] Foreign Application Priority Data

May 25, 1994 [FR] France ................... 94 06322

[51] Int. Cl.⁶ ........................... G01R 19/25
[52] U.S. Cl. ................. 364/574; 364/572; 324/126; 324/130
[58] Field of Search ................. 364/574, 572, 364/573, 575, 724.01, 825; 324/103 R, 103 P, 126, 127, 130; 361/15, 16, 17

[56] References Cited

U.S. PATENT DOCUMENTS

| | | | |
|---|---|---|---|
| 4,059,818 | 11/1977 | Kostelnicek | 367/46 |
| 4,327,390 | 4/1982 | Despiney | 361/16 |
| 4,763,068 | 8/1988 | Schmitt et al. | 324/126 |
| 5,068,598 | 11/1991 | Moncorge | 324/107 |
| 5,212,658 | 5/1993 | Krogmann | 364/572 |
| 5,323,330 | 6/1994 | Asplund et al. | 364/492 |
| 5,546,332 | 8/1996 | Strobach | 364/572 |

FOREIGN PATENT DOCUMENTS

| | | |
|---|---|---|
| 0190455A1 | 8/1986 | European Pat. Off. |
| 0415313A1 | 3/1991 | European Pat. Off. |
| 2651889A1 | 3/1991 | European Pat. Off. |
| 2102972A | 2/1983 | United Kingdom |
| 2234133A | 1/1991 | United Kingdom |

OTHER PUBLICATIONS

*Database WPI*, Week 7924, Derwent Publications Ltd., London, GB; AN 79-F2999B C24 & SU-A-620 030 (Atakhanov) 28 Jun. 1978.

*Primary Examiner*—Emanuel T. Voeltz
*Assistant Examiner*—Demetra R. Smith
*Attorney, Agent, or Firm*—Sughrue, Mion, Zinn, Macpeak & Seas, PLLC

[57] ABSTRACT

A method of eliminating a disturbing component from a periodic signal. The method includes the steps performing at least two measurements on the signal at two distinct instants, calculating the parameters of the disturbing component on the basis of the measurements, and subtracting the disturbing component from the signal. The invention is applicable to making an electronic capacitor voltage transformer comprising a capacitor divider constituted by a high tension capacitor and a low tension capacitor. The transformer includes a microprocessor programmed to perform the above method on the signal from the low tension capacitor.

8 Claims, 3 Drawing Sheets

METHOD AND APPARATUS FOR ELIMINATING A DISTURBING COMPONENT FROM A PERIODIC SIGNAL, AND APPLICATION TO AN ELECTRONIC CAPACITOR VOLTAGE TRANSFORMER

The present invention relates to a method and to apparatus enabling a disturbing component to be removed from a periodic signal, which disturbing component is usually an exponential component, with the invention having a particularly advantageous application in the field of electronic capacitor voltage transformers, and the description below relates to that application.

BACKGROUND OF THE INVENTION

It is recalled that an electronic capacitor voltage transformer (ECVT) is a device comprising a capacitor divider used for measuring the voltage of an electricity line (or cable) at high or at very high tension.

A major difficulty encountered in measuring the voltage of a line by means of an ECVT, in particular one comprising a high tension capacitor Ca and a low tension capacitor Cb, stems from charge which remains trapped on the line when the line is switched to an open circuit condition. Unloaded, the line behaves like a high capacitance capacitor CL. This gives rise to a DC voltage Up which may have a high value if the line was opened while it was on a voltage peak. This voltage decreases exponentially with a time constant of the order of one or more days, depending on various leakage resistances, that in turn vary with weather conditions. The low voltage capacitor Cb of the ECVT discharges quickly through the bias resistor R2 across its terminals, whereas the high voltage capacitor Ca remains charged to line voltage Up. When the line is put back under tension, the low DC impedance of the grid discharges the line almost instantaneously, thereby transferring charge from Ca to Cb which is then charged to a voltage U2 equal to $-U_p \times C_a/C_b$.

This voltage which decreases exponentially with a time constant R2Cb is superposed on the working sinewave signal and it constitutes an error that is very large.

U.S. Pat. No. 4,763,068 describes a method of eliminating the disturbing DC component when a line having trapped charge is brought back into service. The method comprises operations of estimating the disturbing component and of adding the estimated value in antiphase to the signal.

In that document, the authors assume that the disturbing component is DC and substantially constant. The method used for estimating the disturbing component is thus a constant value method.

That method works with open type equipment in which the capacitances of the capacitor dividers are high, giving rise to a time constant that is very large for the disturbing component, thus making it valid to assume that it has a value which is substantially constant. However, that method is poorly adapted to correcting an exponential disturbing component having a time constant of the order of 100 ms. Correction will only take place after a delay.

OBJECTS AND SUMMARY OF THE INVENTION

An object of the present invention is to define apparatus making it possible to eliminate the disturbing component that arises in circuits using metal-clad type equipment in which the disturbing component is exponential, having a short time constant, typically 100 milliseconds.

The invention provides a method of eliminating a disturbing component from a periodic signal, the method comprising the following operations:

performing at least two measurements on the signal at two distinct instants;

calculating the parameters of the disturbing component on the basis of said measurements; and subtracting said disturbing component from the signal.

Advantageously, the signal is subjected to a filtering operation to eliminate high frequencies or harmonics.

In a particular implementation of the method, the signal is measured at a pair of instants that are separated by a duration equal to $\pi/\omega$, where $\omega$ is the angular frequency of the periodic signal, and the parameters of the disturbing component are calculated by taking the difference between the two measurements.

In a variant, a plurality of pairs of measurements are performed on the signal, with the measurements in each pair being performed at instants that are separated by $\pi/\omega$, the parameters of the disturbing component being deduced from the results obtained for each pair of measurements, e.g. by averaging.

The invention also provides apparatus for implementing the above-defined method, including a microprocessor receiving the signal and programmed to perform at least two measurements of the signal at distinct intervals, to calculate the parameters of the disturbing component on the basis of said measurements, and to subtract said disturbing component from the signal.

The invention also provides an electronic capacitor voltage transformer comprising a capacitor divider constituted by a high tension capacitor and a low tension capacitor, including a microprocessor programmed to perform the above-defined method on the signal from the low tension capacitor.

BRIEF DESCRIPTION OF THE DRAWINGS

The invention is described below in detail with reference to the accompanying drawings, in which.

MORE DETAILED DESCRIPTION

Figure 1:
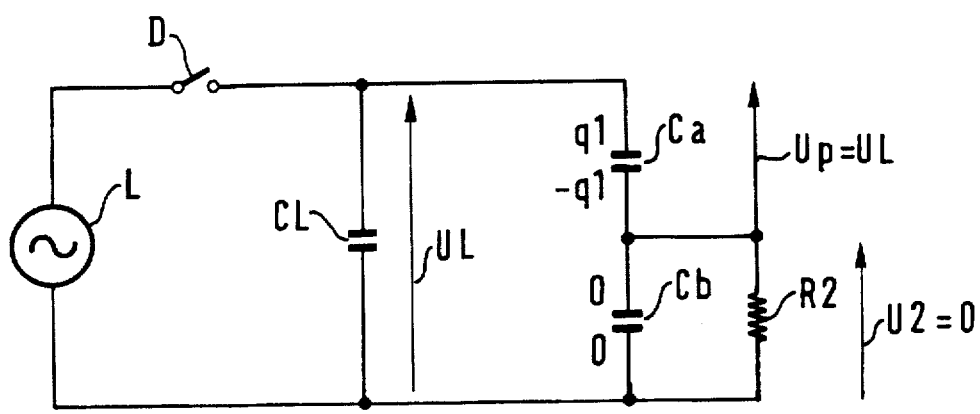
FIG. 1 is an equivalent circuit diagram of a line and an electronic capacitor voltage transformer (ECVT)

In FIG. 1, reference L designates an AC line (or cable) having a circuit breaker D.

Figure 2A:
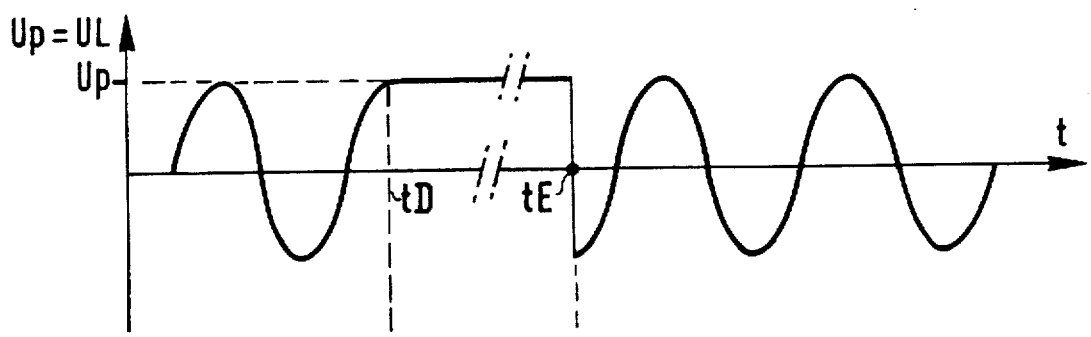
FIG. 2A is a waveform diagram showing the voltage across the terminals of the high tension capacitor of an ECVT during successive line disconnection and reconnection operations.
Figure 2B:
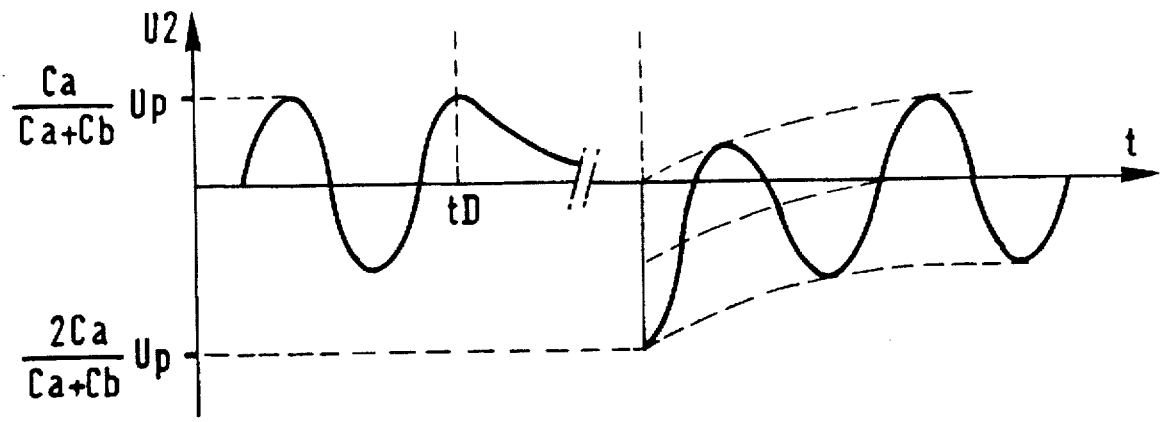
FIG. 2B is a corresponding waveform diagram applicable to the voltage across the terminals of the low tension capacitor of the ECVT.

FIGS. 1, 2A, and 2B illustrate the explanation given above concerning the appearance of a disturbance exponential component on reconnection, and it is pointless to describe them further. Abscissa points tD and tE correspond respectively to the instants at which the circuit breaker is opened and then reclosed.

The method of the invention comprises a first stage of detecting that line tension has been re-established and of estimating the parameters of the exponential component, and a second stage of correcting the measured signal by subtracting the estimated exponential component therefrom.

The presence of tension can be detected, for example, by means of a selective filter tuned to line frequency (50 Hz or 60 Hz depending on the grid), followed by a peak detector and by thresholding with hysteresis.

The apparatus for estimating the parameters of the exponential component is activated by detecting tension on reconnection. The estimate is established on the following principles.

On reconnection, the output signal u(t) across the terminals of the low tension capacitor Cb has the following form:

$$u(t) = A.\cos(\omega t + \phi) + B.\exp(-t/\tau)$$

in which expression:

$A.\cos(\omega t + \phi)$ is the wanted component of the signal; and $B.\exp(-t/\tau)$ is the disturbing component.

If the signal u(t) is measured at two successive instants t1 and t1+π/ω, then:

$$u(t1) = A.\cos(\omega t1 + \phi) + B.\exp(-t1/\tau); \text{ and}$$

$$u(t1+\pi/\omega) = A.\cos(\omega t1 + \phi + \pi) + B.\exp(-(t1+\pi/\omega)/\tau) = -A.\cos(\omega t1 + \phi) + B.\exp(-t1/\tau)\exp(-\pi/\omega\tau)$$

By adding the above equations, term by term:

$$u(t1) + u(t1+\pi/\omega) = (1+\exp(-\pi/\omega\tau)).B.\exp(-t1/\tau)$$

The coefficient B is therefore equal to:

$$(u(t1)+u(t1+\pi/\omega))/[(1+\exp(-\pi/\omega\tau)).\exp(-t1/\tau)]$$

Knowledge of B enables the disturbance to be characterized.

It may be observed that this estimate of B is made on the assumption that the signal u(t) does indeed have the form specified above.

If high frequencies or harmonics are also present, it may be necessary:

either to pre-filter the signal u(t);

or else to calculate the value of B for several pairs of values t1 and t1+π/ω and take a mean value.

Naturally, the signal as measured at two instants that are spaced apart by π/ω is merely an example chosen because it facilitates computation. More generally, it is possible to measure the signal at two arbitrary distinct instants and, by calculation, to deduce therefrom the values of the parameters characterizing the disturbing component. For Greater accuracy, it is possible to perform more than two measurements of the signal at distinct instants. It is also possible to perform a plurality of pairs of measurements at instants that are separated, in each pair, by π/ω and to deduce therefrom the values of the parameters characterizing the disturbing component by averaging or by some other method.

Knowledge of B makes it possible to generate a signal $B.\exp(-t/\tau)$ for subtraction from the received signal u(t). This produces a corrected signal in which allowance is made for the disturbing exponential component.

Figure 3:
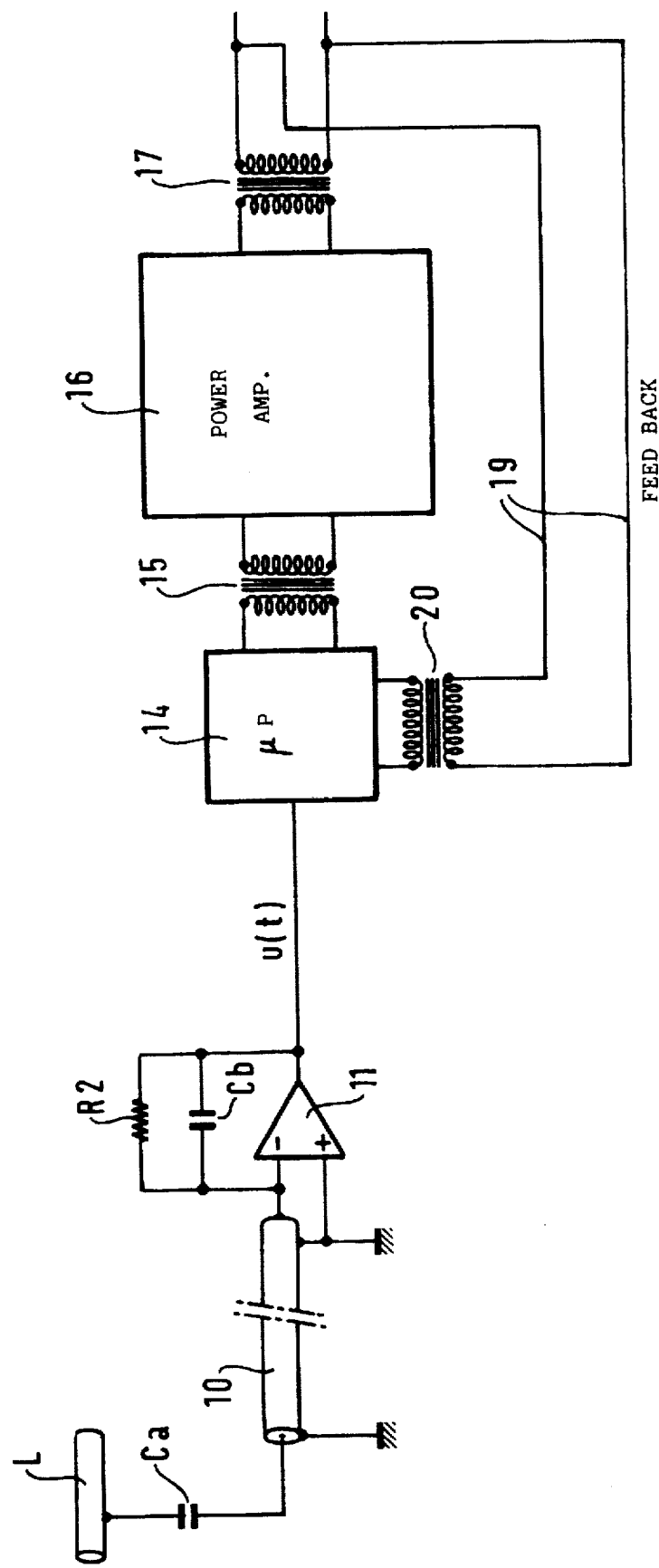
FIG. 3 is a circuit diagram of an electronic capacitor voltage transformer (ECVT)

FIG. 3 is a circuit diagram of a practical embodiment of an ECVT provided with correction apparatus of the invention. Reference may be made, for example, to U.S. Pat. No. 5,068,598, which describes a capacitor voltage reducer from which the device now described is derived.

Reference L designates the line whose voltage is being measured. High tension capacitor Ca is connected firstly to the line L and secondly, via a coaxial cable 10, to the negative input of an operational amplifier 11. Low tension capacitor Cb in parallel with a resistor R2 is connected between the output of said amplifier and its negative input. The positive input of the amplifier is grounded.

The output signal from the amplifier, u(t), is applied to the input of a signal processor block 14, e.g. a microprocessor, whose function is specifically to perform the correction operations whose theory is explained above: detecting the appearance of the signal; sampling the signal; calculating the parameters that characterize the disturbing component; subtracting the disturbing component from the signal; and providing the wanted signal.

The apparatus also includes an isolating transformer 15, a power amplifier 16, and a power transformer 17 across whose terminals the corrected and amplified signal is taken. The amplifier is provided with a negative feedback loop 19 that includes a negative feedback transformer 20. Stability is ensured by the microprocessor 14, as described in French patent No. 89 11 386 of Aug. 30, 1989.

Figure 4:
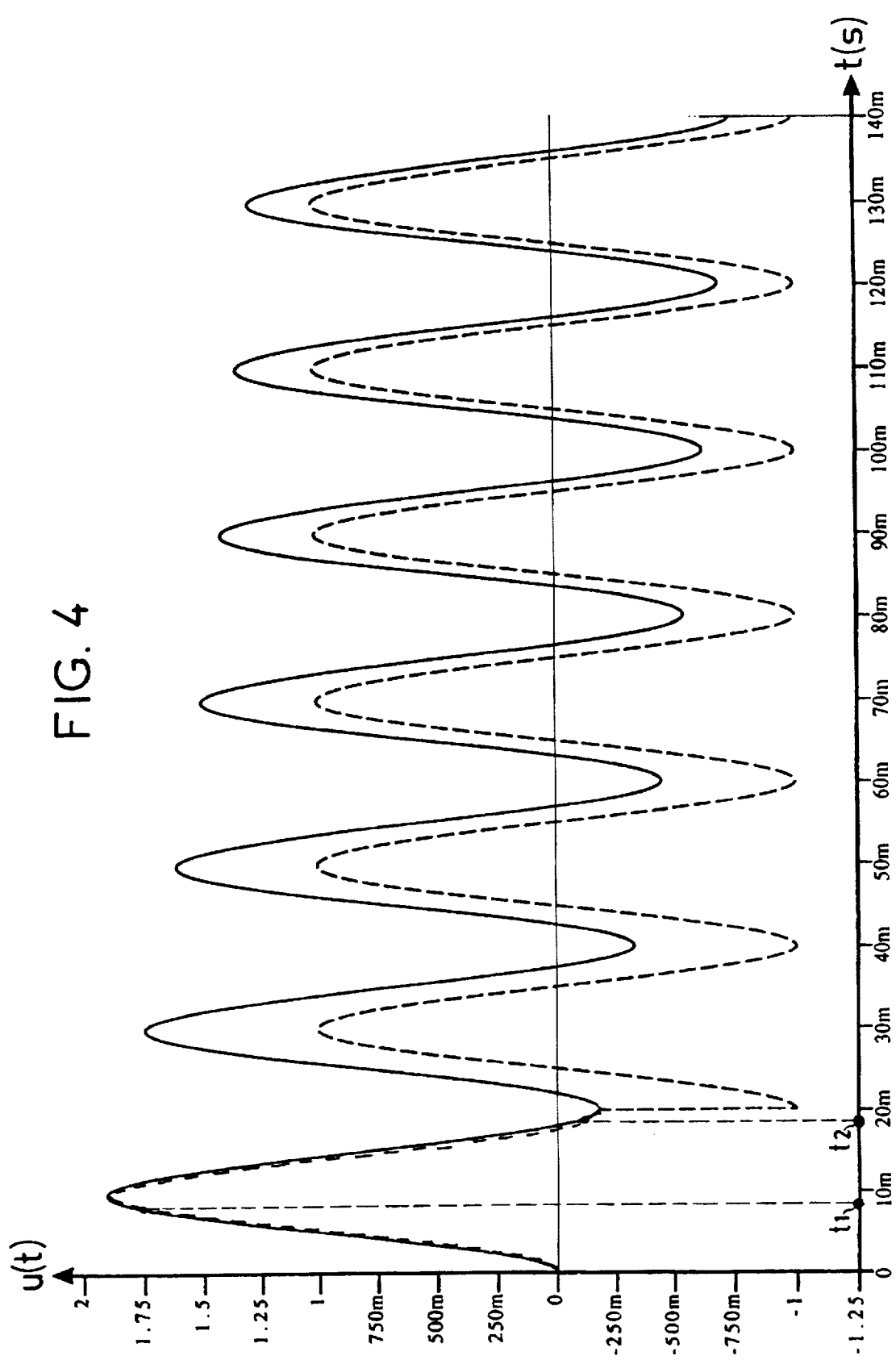
FIG. 4 is a waveform diagram showing the appearance of the periodic signal as disturbed by an exponential component, and also showing the appearance of the corrected signal.

FIG. 4 is a waveform diagram showing that excellent correction can be obtained. The solid line curve corresponds to the uncorrected signal. The dashed line curve corresponds to the signal after correction.

Abscissa point t1 at 8 milliseconds (arbitrary), and t2 at 18 milliseconds (i.e. t1+π/ω at 50 Hz), correspond to the two measurement instants of the signal u(t).

After instant t2, the corrected signal is almost immediately cleared of its disturbing component.

It may be observed that the method used in the above-specified prior art is a purely linear method (ignoring signal digitization). The digital algorithm implemented is merely a recursive filter. As a result the correction branch must also have a phase rotation effect on the 50 Hz component, and that reduces the accuracy of the measurement reducer.

The apparatus of the invention estimates the disturbing component by means of a non-linear method that has no effect whatsoever on accuracy at 50 Hz, thereby making it possible for the measurement reducer to obtain not only the accuracy required for protection purposes, but also the greater accuracy required for measurement purposes.

The invention is applicable to any electronic measurement circuit in which the output signal is disturbed by an aperiodic component having a short time constant.

We claim:

1. A method of eliminating a disturbing component from a periodic signal, the method comprising the following operations:

performing at least two measurements on the signal at two distinct instants;

calculating the parameters of the disturbing component on the basis of said measurements; and subtracting said disturbing component from the signal.

2. A method according to claim 1, wherein the signal is subjected to a filtering operation to eliminate high frequencies or harmonics.

3. A method according to claim 1, wherein the signal is measured at a pair of instants that are separated by a duration equal to π/ω, where ω is the angular frequency of the periodic signal, and the parameters of the disturbing component are calculated by taking the difference between the two measurements.

4. A method according to claim 1, wherein a plurality of pairs of measurements are performed on the signal, with the measurements in each pair being performed at instants that are separated by π/ω, where ω is the angular frequency of the periodic signal, the parameters of the disturbing component being deduced from the results obtained for each pair of measurements, e.g. by averaging.

5. Apparatus for implementing the method according to claim 1, including a microprocessor receiving the signal and programmed to perform at least two measurements of the signal at distinct intervals, to calculate the parameters of the disturbing component on the basis of said measurements, and to subtract said disturbing component from the signal.

6. An electronic capacitor voltage transformer comprising a capacitor divider constituted by a high tension capacitor and a low tension capacitor, the transformer further comprising a microprocessor programmed to perform the method according to claim 1 on the signal from the low tension capacitor.

7. A method according to claim 1, wherein said performing step performs said at least two measurements at the same point of a conductor through which said periodic signal passes.

8. An electronic capacitor voltage transformer according to claim 6, wherein said performing step performs said at least two measurements at the same point of a conductor through which said signal passes.

* * * * *